United States Patent [19]

Shimada

[11] Patent Number: 4,541,002
[45] Date of Patent: Sep. 10, 1985

[54] PROTECTIVE DEVICE FOR A SEMICONDUCTOR INTEGRATED CIRCUIT INCLUDING DOUBLE POLYSILICON RESISTOR

[75] Inventor: Hiroshi Shimada, Tokyo, Japan

[73] Assignee: Fujitsu Limited, Kawasaki, Japan

[21] Appl. No.: 393,117

[22] Filed: Jun. 28, 1982

[30] Foreign Application Priority Data

Jun. 30, 1981 [JP] Japan .......................... 56-100505

[51] Int. Cl.³ .................................... H01L 27/02
[52] U.S. Cl. .................... 357/51; 357/23.13; 357/41; 357/59; 361/56; 361/91
[58] Field of Search ............... 357/23 GP, 41, 51, 59, 357/55; 361/56, 91

[56] References Cited

U.S. PATENT DOCUMENTS 4,244,000  1/1981  Ueda et al. .......................... 357/59
4,270,137  5/1981  Coe ..................................... 357/59
4,352,997  10/1982 Raymond et al. ................... 357/59

FOREIGN PATENT DOCUMENTS 54-116887  9/1979  Japan ............................ 357/23 GP

OTHER PUBLICATIONS

IBM Technical Disclosure Bulletin, "Protect Device for LSI Fet Circuits", by N. Edwards, vol. 22, No. 6, Nov. 1979, p. 2326.
IBM Technical Disclosure Bulletin, "Resistor-Thick Oxide FET Gate Protection Device for Thin Oxide FET", by W. Fischer, vol. 13, No. 5, Oct. 1970, pp. 1272–1273.
Patents Abstracts of Japan, vol. 3, No. 10, Jan. 29, 1979, p. 93, #53-138,679.
16th Annual Proceedings on Reliability Physics, "VMOS Electrostatic Protection", by I. S. Bhatti et al., Apr. 1978, pp. 140–145.
IEEE Transactions on Electron Devices, "A Novel MOS PROM using a Highly Resistive Poly-Si Resistor", by M. Tanimoto et al., vol. ED-27, No. 3, Mar. 1980.

Primary Examiner—Joseph E. Clawson, Jr.
Attorney, Agent, or Firm—Staas & Halsey

[57] ABSTRACT

A protective device for protecting a semiconductor integrated circuit from the destruction phenomenon which occurs due to an extremely high input voltage. The protective device comprises a protective input MIS transistor having a semiconductor substrate, a diffusion region formed in the semiconductor substrate, and an input electrode wiring layer electrically connected to the diffusion region. The input electrode wiring layer does not directly contact the diffusion region, rather, it contacts the diffusion region through a first polysilicon layer and a second polysilicon layer. The first polysilicon layer is formed on an insulating film adjacent to the diffusion region, and the second polysilicon layer is formed so as to be in contact with the first polysilicon layer and the diffusion region. The concentration of impurities in the first polysilicon layer is higher than that in the second polysilicon layer.

9 Claims, 8 Drawing Figures

PROTECTIVE DEVICE FOR A SEMICONDUCTOR INTEGRATED CIRCUIT INCLUDING DOUBLE POLYSILICON RESISTOR

BACKGROUND OF THE INVENTION

1. Field of the Invention

This invention relates to a protective device for a semiconductor integrated circuit. More particularly, it relates to a device for protecting a semiconductor integrated circuit from the destruction phenomena caused by a high voltage applied to the input terminal of the semiconductor integrated circuit.

2. Description of the Prior Art

Conventionally, at the input stage of a semiconductor integrated circuit, a protective MIS (metal-insulator semiconductor) transistor is provided to protect the input transistor in an internal integrated circuit (hereinafter referred to as an internal IC) from a high voltage input caused by static electricity. The protective MIS transistor has a gate oxidation film thicker than that in the internal IC so that the protective MIS transistor does not operate under a normal operating voltage and operates only when a high voltage is applied. The diffusion region, that is, the drain region of the MIS transistor, is extended so as to have a resistance region which also protects the internal IC from a high voltage. At the end of the resistance region, the diffusion region is directly and electrically in contact with an input electrode wiring layer.

In such a conventional structure, however, since the diffusion region directly contacts the input electrode wiring layer, the tolerance voltage at the input electrode is relatively low. That is, when a high voltage of, for example, 200 V is applied to the input electrode wiring layer, the electrode metal and the diffusion region contacting the electrode metal generates an excessive alloy which easily penetrates through the diffusion region and short circuits the semiconductor substrate with the diffusion region. As a result, the internal IC cannot be driven even when a normal signal voltage is applied to the input electrode wiring layer because the input signal is directly conducted to the semiconductor substrate. Also, due to the presence of the resistance region in the diffusion region, the diffusion region in the protective MOS transistor is large. Further, the junction capacitance between the contact portion of the diffusion region and the semiconductor substrate causes the input impedance of the internal IC to be large so that the operating speed of the semiconductor integrated circuit is deteriorated.

SUMMARY OF THE INVENTION

Accordingly, an object of the present invention is to provide a protective device for a semiconductor integrated circuit in which the tolerance voltage for the destruction phenomena between the input electrode wiring layer and the semiconductor substrate is increased.

Another object of the present invention is to provide such a protective device as described above in which the protective input resistance region in the diffusion region is decreased.

Still another object of the present invention is to provide such a protective device as described above in which the junction capacitance between the diffusion region and the semiconductor substrate is decreased.

In order to accomplish the above objects, there is provided a protective device for a semiconductor integrated circuit comprising a protective input MIS transistor having a diffusion region and a semiconductor substrate under the diffusion region for protecting the semiconductor integrated circuit from a high input voltage and an input electrode metal layer electrically connected to the diffusion region of the protective input MOS transistor. According to the present invention, the protective device further comprises an insulating film formed on the surface of the semiconductor substrate and arranged adjacent to the diffusion region, a first polysilicon MIS layer having a high concentration of impurities formed on the insulating film and electrically contacting the input electrode metal layer, and a second polysilicon layer having an impurity concentration lower than the concentration of the first polysilicon layer and electrically contacting the peripheral portion of the first polysilicon layer and the diffusion layer.

BRIEF DESCRIPTION OF THE DRAWINGS

The above objects and advantages as well as other features of the present invention will be better understood from the following more detailed description with reference to the accompanying drawings in which.

DESCRIPTION OF THE PREFERRED EMBODIMENTS

Before describing the embodiments of the invention, a conventional device and the problem involved with this device will first be described with reference to FIGS. 1 through 3.

Figure 1:
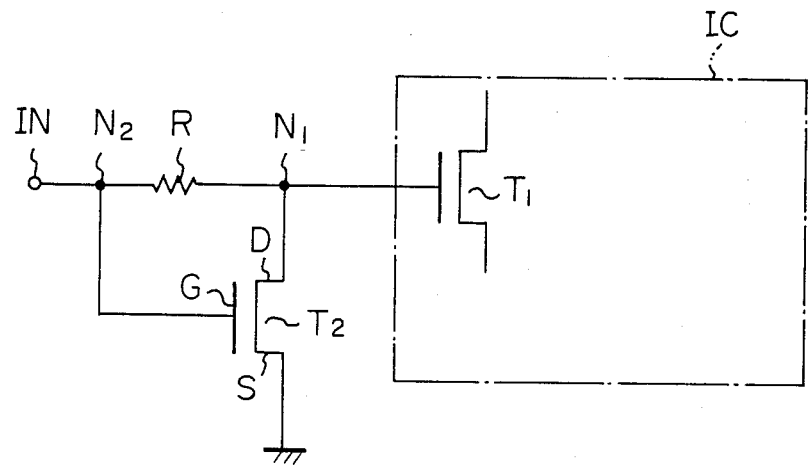
FIG. 1 is a conventional example of a circuit diagram of a protective circuit connected to an input stage of a semiconductor integrated circuit.

FIG. 1 is a circuit diagram of a conventional device of a protective circuit connected to an input stage of a semiconductor integrated circuit. In FIG. 1, IC is a semiconductor integrated circuit, $T_1$ is a MOS transistor at the input stage of the semiconductor integrated circuit IC, R is a protective resistor, and $T_2$ is a protective MOS transistor. The gate of the input stage MOS transistor $T_1$, one end of the protective resistor R, and the drain D of the protective MOS transistor $T_2$ are connected at a first contact portion $N_1$. The other end of the protective resistor R and the gate of the protective MOS transistor $T_2$ are connected at a second contact portion $N_2$. The second contact portion $N_2$ is connected to an input terminal IN. The source S of the protective MOS transistor $T_2$ is grounded.

Figure 2:
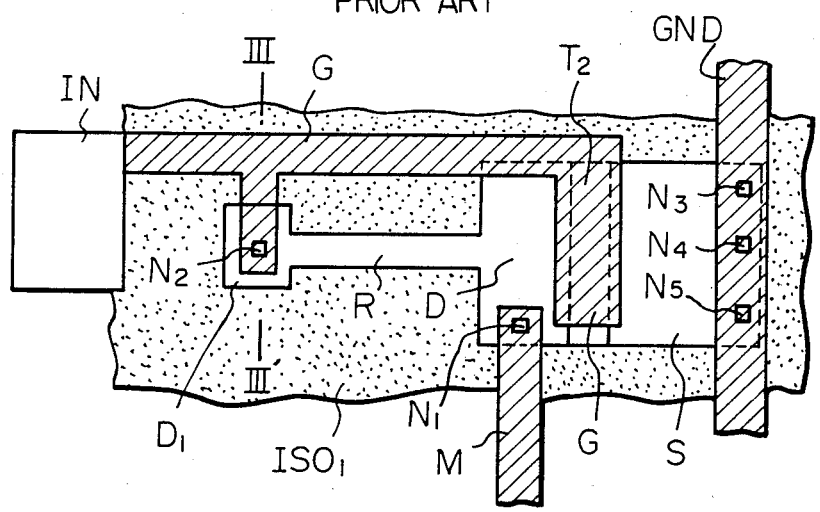
FIG. 2 is a plan view of a main portion of the protective circuit of the conventional device realizing the circuit of FIG. 1.

FIG. 2 is a plan view of the protective circuit of a conventional device realizing the circuit of FIG. 1. In FIG. 2, the protective MOS transistor $T_2$, the protective resistor R, and the input terminal IN are illustrated. S and D represent impurity diffusion regions which are the source and the drain of the protective MOS transistor $T_2$. A gate electrode metal layer G is arranged so as to cover a part of one side of the impurity diffusion region D and a part of one side of the impurity diffusion region S. The metal layer G is connected to the input terminal IN. At a first contact portion $N_1$, the diffusion region D, that is, the drain of the protective transistor $T_2$, electrically contacts another metal layer M. The metal layer M is connected to the gate of the input stage transistor $T_1$ in the semiconductor integrated circuit IC (FIG. 1). The diffusion region S, that is, the source of the protective transistor $T_2$, electrically contacts a grounding electrode GND at contact portions $N_3$, $N_4$, and $N_5$. The diffusion region D is extended to form the protective resistor R. At an end portion $D_1$ of the protective resistor R, a second contact portion $N_2$ is provided. At the second contact portion $N_2$, the end portion $D_1$ of the resistor region R, that is, the other end of the protective resistor R, electrically contacts the gate electrode metal layer G. An insulation film $ISO_1$ is formed on the surface of the semiconductor substrate (not shown in FIG. 2) except for the diffusion regions D and S and an active region between the diffusion regions D and S. The insulation film $ISO_1$ insulates the protective transistor $T_2$ and the protective resistor R from other elements.

In the structure of the conventional device illustrated in FIG. 2, a problem exists in that the diffusion region D must be large since the diffusion region must be extended in order to incorporate the protective resistor R. Also, if a high voltage of, for example, 200 V or more, is applied to the second contact portion $N_2$, the electrode metal destroys the diffusion region under it and contacts with the semiconductor substrate under the diffusion region. This destruction phenomena will now be described with reference to FIG. 3.

Figure 3:
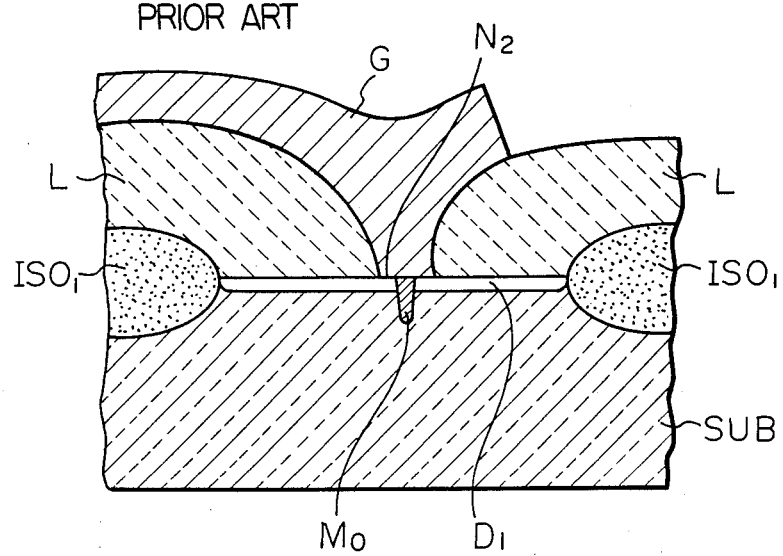
FIG. 3 is an expanded cross-sectional view taken along line III—III' of FIG. 2.

FIG. 3 is an expanded cross-sectional view taken along line III—III' of FIG. 2. In FIG. 3, the diffusion region $D_1$, that is, the end portion $D_1$ of the protective resistor R (FIG. 2), is formed beneath the surface of a semiconductor substrate SUB. The type of conductivity of the semiconductor substrate SUB is opposite to that of the diffusion region $D_1$. The periphery of the diffusion region $D_1$ is insulated from other elements (not shown) by a first insulating film $ISO_1$. An oxidation film L for insulating between layers is formed so as to cover the diffusion region $D_1$, except for the contact portion $N_2$ a metal layer G is formed on the insulating oxidation film L and on the contact portion $N_2$.

During normal operation, a sufficiently low voltage of, for example, 5 V is applied to the input terminal IN (see FIGS. 1 and 2). In this case, the electrode metal does not destroy the diffusion region $D_1$ at the second contact portion $N_2$ and the input voltage is definitely applied through the metal layer G, the protective resistor R, the diffusion region D, and the metal layer M to the gate of the input stage MOS transistor $T_1$ (see FIGS. 1 and 2). In contrast, if an extremely high voltage of, for example, 200 V or more is applied, due to static electricity, to the input terminal IN, a part $M_0$ of the electrode metal destroys the diffusion region $D_1$ and contacts the semiconductor substrate SUB. As a result, the electrode metal is short-circuited to the semiconductor substrate SUB so that the semiconductor integrated circuit IC (FIG. 1) cannot be driven. In addition, due to a PN junction capacitor between the diffusion region $D_1$ under the contact portion $N_2$, and the semiconductor substrate, the input carriers are stored in or discharged from the PN junction capacitor so that the operating speed of the semiconductor integrated circuit is deteriorated.

The present invention will now be described in detail with reference to FIGS. 4 through 6, in which the above-mentioned destruction phenomena is prevented and the necessary space for the diffusion region of the protective resistor is decreased, as is the PN junction capacitance at the contact portion.

Figure 4:
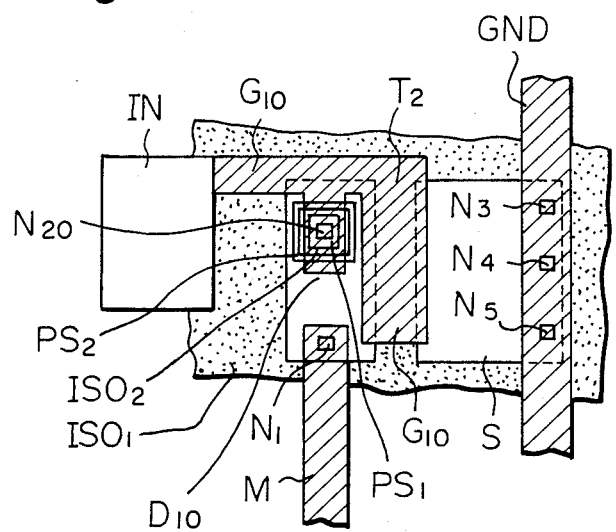
FIG. 4 is a plan view of a main portion of a protective device according to a first embodiment of the present invention.

FIG. 4 is a plan view of a main portion of a protective device according to a first embodiment of the present invention. In FIG. 4, the same or similar portions are denoted by the same reference symbols as the reference symbols employed in FIG. 2.

The difference between the plan view of FIG. 2 and the plan view of FIG. 4 is that in FIG. 2 the protective resistor R having the end portion $D_1$ is formed by extending the diffusion region D while in FIG. 4 the diffusion region $D_{10}$ is not extended so as to form a protective resistor having an end portion. Therefore, the length of the gate electrode metal layer $G_{10}$ of the protective transistor $T_2$ in FIG. 4 is greatly reduced in comparison with the conventional structure shown in FIG. 2. In FIG. 4, $ISO_2$ represents a second insulating film formed in the diffusion region $D_{10}$. A contact portion $N_{20}$ is provided in the diffusion region $D_{10}$ so that the gate electrode metal layer $G_{10}$ electrically contacts, through a first polysilicon layer $PS_1$ and a second polysilicon layer $PS_2$, the diffusion layer $D_{10}$. The diffusion region $D_{10}$ not only provides a space for the contact portion $N_1$ to make the gate electrode metal layer $G_{10}$ contact the diffusion region $D_{10}$, but also provides a space for the drain of the protective MOS transistor $T_2$. The structure of FIG. 4 will be described in more detail with reference to FIGS. 5 and 6.

Figure 5:
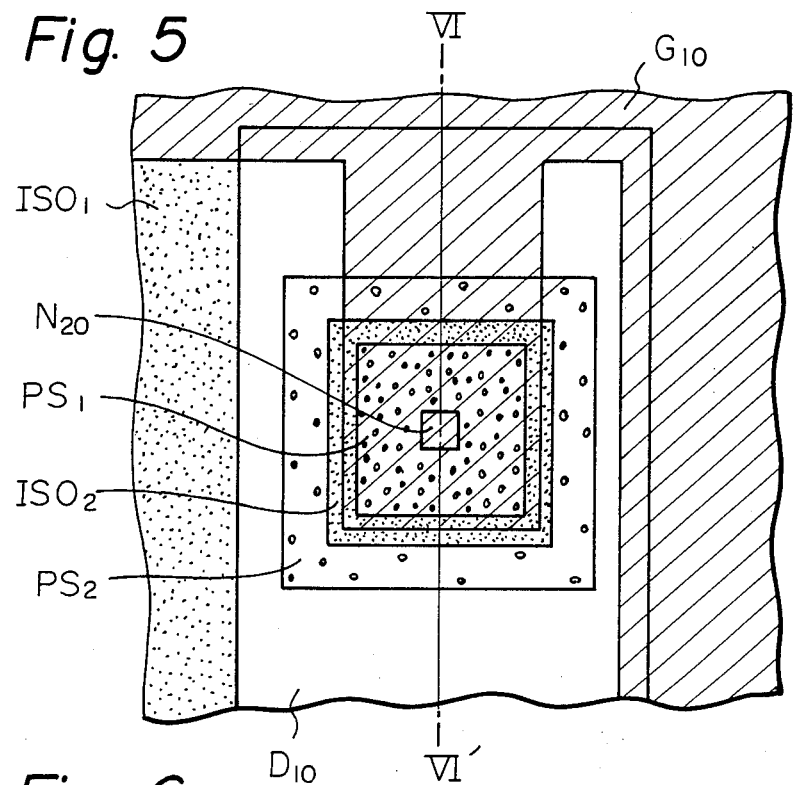
FIG. 5 is an enlarged plan view of part of the plan view of FIG. 4.

FIG. 5 is an enlarged plan view illustrating the contact portion $N_{20}$ and the periphery of the contact portion $N_{20}$ of FIG. 4. FIG. 6 is a cross-sectional view taken along line VI—VI' of FIG. 5. In FIGS. 5 and 6, the second insulating film $ISO_2$ is provided in the portion of the diffusion region $D_{10}$ near the gate electrode metal layer $G_{10}$. Therefore, the second insulating film $ISO_2$ is surrounded by the diffusion region $D_{10}$ on all sides. In other words, the second insulating film $ISO_2$ is formed as an island in the diffusion region $D_{10}$. The center of the surface of the second insulating film $ISO_2$ substantially corresponds to the contact portion $N_{20}$. Thus, the central portion of the diffusion region $D_{10}$ is insulated from other layers by the second insulating film $ISO_2$. The periphery of the diffusion region $D_{10}$ is also insulated from other elements (not shown) by the first insulating film $ISO_1$. On the second insulating film $ISO_2$, a first polysilicon layer $PS_1$ having a high concentration of impurities is formed. A second polysilicon layer $PS_2$, having a concentration of impurities lower than the concentration of the first polysilicon layer $PS_1$, is formed so as to electrically contact the first polysilicon layer $PS_1$ and the diffusion region $D_{10}$. That is, the second polysilicon layer $PS_2$ surrounds a part of the periphery of the second insulating layer $ISO_2$, a part of the periphery of the first polysilicon layer $PS_1$, and a part of the upper surface of the diffusion region D near the periphery of the second insulating film $ISO_2$. A contact portion $N_{20}$ is provided on the upper surface of the first polysilicon layer $PS_1$. An oxidation film $L_1$ for insulating between layers is also formed on the first polysilicon layer $PS_1$, except for the contact portion $N_{20}$, on the second polysilicon layer $PS_2$, on the remainder of the portion of the diffusion region $D_{10}$ not covered by the second polysilicon layer $PS_2$, and on the first insulating film $ISO_1$. A gate electrode metal layer $G_{10}$ is formed on the oxidation film $L_1$ and the contact portion $N_{20}$.

Figure 6:
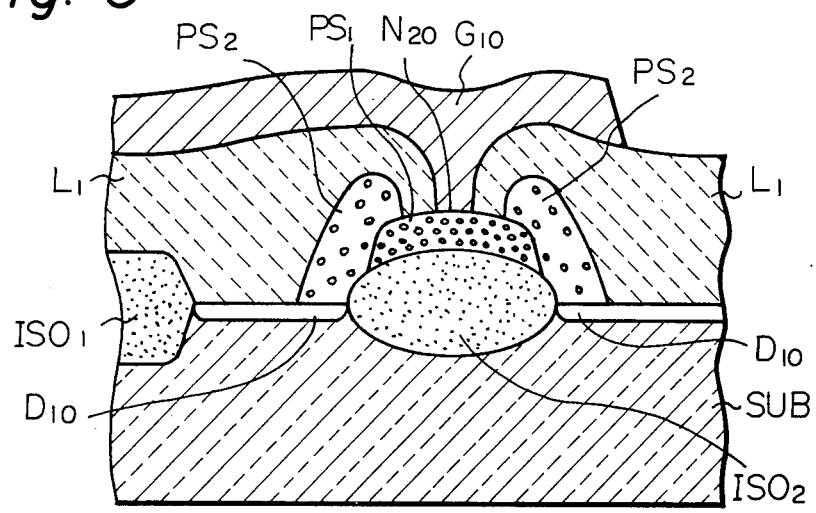
FIG. 6 is a cross-sectional view taken along line VI—VI' of FIG. 5.

In the structure illustrated in FIGS. 4, 5, and 6, even when a high voltage of up to 500 V is applied to the gate electrode metal layer $G_{10}$ connected to an imput terminal, the electrode metal does not destroy through the diffusion region $D_{10}$ and contact the semiconductor substrate because of the presence of the first polysilicon layer $PS_1$ and the second insulating film $ISO_2$. Also, because the concentration of impurities in the first polysilicon layer $PS_1$ is higher than the concentration of impurities in the second polysilicon layer $PS_2$, the electrical resistance of the first polysilicon layer $PS_1$ is lower than the electrical resistance of the second polysilicon layer $PS_2$. Therefore, a good electric contact is effected between the gate electrode metal layer $G_{10}$ and the first polysilicon layer $PS_1$. The second polysilicon layer $PS_2$ acts as a protective resistor similar to the protective resistor R shown in FIG. 1. Therefore, during normal operation, an electrical path is formed between the gate electrode metal layer $G_{10}$ and the diffusion region $D_{10}$ through the first and the second polysilicon layers. Thus, extending the conventional diffusion region D and the resistance region R as illustrated in FIG. 2 is not necessary according to the present invention. Further, under the contact portion $N_{20}$, there is only the first polysilicon layer $PS_1$ and the insulating film $ISO_2$. Therefore, almost no PN junction capacitance is present at the contact portion $N_{20}$. Accordingly, the input impedance for the semiconductor integrated circuit is decreased in comparison with the conventional device.

Figure 7:
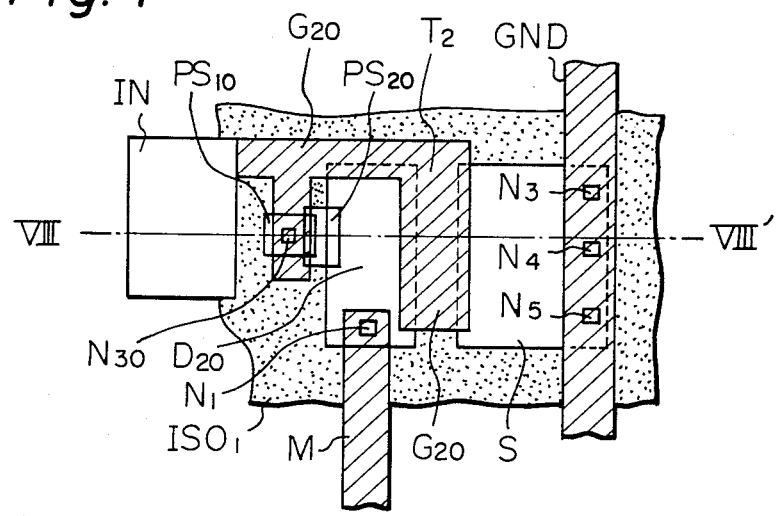
FIG. 7 is a plan view of a main portion of a protective device according to a second embodiment of the present invention.
Figure 8:
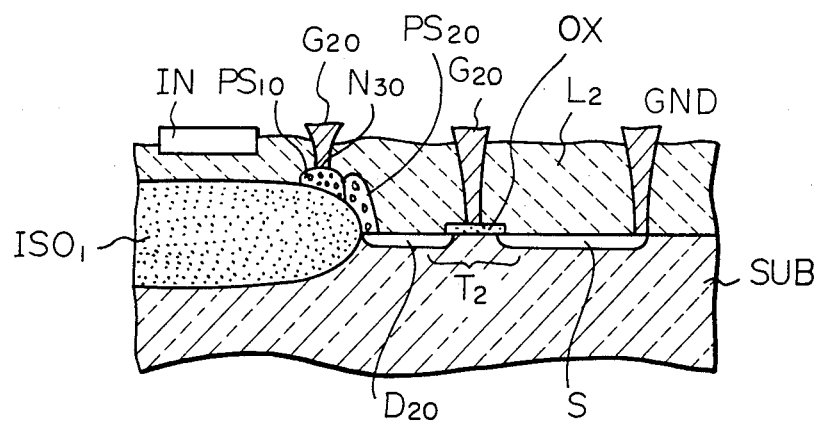
FIG. 8 is a cross-sectional view taken along line VIII—VIII' of FIG. 7.

FIG. 7 is a plan view of a main portion of a protective device according to a second embodiment of the present invention. FIG. 8 is a cross-sectional view taken along line VIII—VIII' of FIG. 7. The main difference between the first embodiment and the second embodiment is that instead of forming the second insulation film $ISO_2$ in the portion of the diffusion region $D_{10}$ near the gate electrode metal layer $G_{10}$, no such second insulation film $ISO_2$ is formed in the diffusion region $D_{20}$ (FIG. 7), that is, in the drain region of the protective transistor $T_2$. In FIGS. 7 and 8, a contact portion $N_{30}$ is formed in an area adjacent to the diffusion region $D_{20}$. More precisely, as is apparent from FIGS. 2, 4, and 7, the first insulating film $ISO_1$ which is for insulating the drain diffusion region $D_{20}$, the source diffusion region S, and the active region between the regions $D_{20}$ and S from other elements, is adjacent to the first diffusion region. In the second embodiment, on the first insulating film $ISO_1$ near the left-hand side of the diffusion region $D_{20}$, a first polysilicon layer $PS_{10}$, having a high concentration of impurities, is formed as illustrated in FIGS. 7 and 8. A second polysilicon layer $PS_{20}$, having a concentration of impurities lower than the concentration of the first polysilicon layer $PS_{10}$ is formed so as to electrically contact the first polysilicon layer $PS_{10}$ and the diffusion region $D_{20}$. The contact portion $N_{30}$ is provided on the upper surface of the first polysilicon layer $PS_{10}$. An oxidation film $L_2$ for insulating between layers also covers the first insulating film $ISO_1$, the first polysilicon layer $PS_{10}$ except for the contact portion $N_{30}$, the second polysilicon layer $PS_{20}$, the diffusion region $D_{20}$, a gate oxide film OX for the transistor $T_2$, the source diffusion region S, and the remainder of the surface of the semiconductor substrate SUB. The gate electrode metal layer $G_{20}$ electrically contacts the first polysilicon layer $PS_{10}$ at the contact portion $N_{30}$.

With the structure illustrated in FIG. 7 or 8, the same or similar effects can be obtained as the effects obtained with the first embodiment.

It will be apparent to those skilled in the art that the present invention is not restricted to the illustrated embodiments but that many other changes and modifications are possible without departing from the spirit of the present invention. For example, instead of forming the contact portion on the left-hand side of the diffusion region in FIG. 7, the contact portion may be formed on the upper side of the diffusion region. Also, a polysilicon wiring layer may be substituted for the input electrode metal layer.

From the forgoing description, it will be apparent that, according to the present invention, at the contact portion of the input electrode wiring layer in a semiconductor integrated circuit, the electrode material is prevented from destroying the diffusion region even when a high voltage of up to 500 V is applied to the input terminal of the semiconductor integrated circuit. Also, the protective resistor region is reduced in comparison with the conventional art. Further, the junction capacitance between the contact region and the diffusion region is reduced so that a low input impedance is obtained, resulting in high-speed operation of the semiconductor integrated circuit.

I claim:

1. A protective device for protecting a semiconductor integrated circuit from static electricity, comprising:
   a protective input transistor for protecting the semiconductor integrated circuit from a high input voltage;
   a semiconductor substrate;
   a diffusion region formed in said semiconductor substrate;
   a first insulating film formed on the surface of said semiconductor substrate adjacent to said diffusion region;
   a second insulating film formed as an island in said diffusion region;
   a first polysilicon layer, having a first concentration of impurities, formed on a portion of said second insulating film;
   a second polysilicon layer, having a second concentration of impurities lower than said first concentration of impurities of said first polysilicon layer, formed on a portion of said second insulating film and connecting a peripheral portion of said first polysilicon layer and said diffusion region;
   a contact portion formed on a portion of said first polysilicon layer;
   an oxidation film, formed over said first insulating film, said exposed portions of said diffusion region and said semiconductor substrate, and said first and second polysilicon layers except for said contact portion, for insulating between layers; and
   an input electrode metal layer, formed over said contact portion, for electrically connecting said diffusion region.

2. A protective device as set forth in claim 1, wherein said second polysilicon layer surrounds part of the periphery of said first insulating film, said first polysilicon layer and said upper surface of said diffusion region.

3. A protective device as set forth in claim 1, wherein said protective input transistor includes a source region and a drain region, and wherein said diffusion region is one of the source or drain regions of said protective transistor.

4. A protective device as set forth in claim 1, wherein said second insulating film is surrounded by said diffusion region on all sides.

5. A protective device as set forth in claim 4, wherein the center of the surface of said second insulating film substantially corresponds to said contact portion.

6. A protective device as set forth in claim 5, wherein said second polysilicon layer forms a protective resistor connected between said input electrode wiring layer and said diffusion region.

7. A protective device as set forth in claim 6, wherein said first polysilicon layer and said second polysilicon layer operatively form an electrical path between said input electrode wiring layer and said diffusion region.

8. A protective device as set forth in claim 4, 5, 6 or 7, wherein said input electrode wiring layer comprises a metal layer.

9. A protective device as set forth in claim 4, 5, 6 or 7, wherein said input electrode wiring layer comprises a polysilicon layer.

* * * * *

UNITED STATES PATENT AND TRADEMARK OFFICE
CERTIFICATE OF CORRECTION

PATENT NO. : 4,541,002
DATED : SEPTEMBER 10, 1985
INVENTOR(S) : HIROSHI SHIMADA

It is certified that error appears in the above-identified patent and that said Letters Patent is hereby corrected as shown below:

Col. 3, line 52, "$N_2a$" should be --$N_2$. A--.

Signed and Sealed this

Tenth Day of December 1985

[SEAL]

Attest:

DONALD J. QUIGG

Attesting Officer   Commissioner of Patents and Trademarks